US 6,606,354 B1

(12) United States Patent
Bach et al.

(10) Patent No.: US 6,606,354 B1
(45) Date of Patent: Aug. 12, 2003

(54) PROCESS AND DEVICE TO MEASURE THE SIGNAL QUALITY OF A DIGITAL INFORMATION TRANSMISSION SYSTEM

(75) Inventors: Roland Bach, Schlaitdorf (DE); Helmut Dollinger, Bempflingen (DE); Wolfgang Hoyer, Pfullingen (DE)

(73) Assignee: Wavetek Wandel Goltermann Eningen GmbH & Co. (DE)

( * ) Notice: Subject to any disclaimer, the term of this patent is extended or adjusted under 35 U.S.C. 154(b) by 0 days.

(21) Appl. No.: 09/427,102

(22) Filed: Oct. 26, 1999

(30) Foreign Application Priority Data

Nov. 2, 1998 (DE) .......................................... 198 50 567

(51) Int. Cl.[7] ............................................... H04B 17/00
(52) U.S. Cl. ...................................................... 375/224
(58) Field of Search .................................. 375/224, 213, 375/215, 226, 294, 327, 354, 355, 371, 373, 376; 329/307, 305, 358, 360, 302; 327/3, 40, 41; 324/76.11, 76.26, 76.52, 76.53, 76.77, 76.79; 455/67.1, 115, 226.1, 264; 702/57, 69, 81, 72; 377/79; 337/44

(56) References Cited

U.S. PATENT DOCUMENTS

| 5,455,536 A | * | 10/1995 | Kono et al. ................... 329/325 |
| 5,585,954 A | | 12/1996 | Taga et al. |
| 5,757,857 A | | 5/1998 | Buchwald |
| 5,787,342 A | * | 7/1998 | Tochihara et al. ............ 455/264 |
| 5,812,619 A | * | 9/1998 | Runaldue ..................... 375/376 |
| 5,896,392 A | * | 4/1999 | Ono et al. .................... 714/705 |
| 5,896,428 A | * | 4/1999 | Yanagiuchi ................... 375/374 |
| 5,945,856 A | * | 8/1999 | Yanagiuchi ................... 327/159 |
| 6,088,413 A | * | 7/2000 | Autry et al. .................. 375/372 |
| 6,148,423 A | * | 11/2000 | Le Mouel et al. ........... 714/708 |
| 6,252,692 B1 | * | 6/2001 | Roberts ....................... 359/110 |
| 6,337,886 B1 | * | 1/2002 | Asahi .......................... 375/316 |
| 6,351,322 B1 | * | 2/2002 | Ransford et al. ............ 359/110 |
| 6,396,889 B1 | * | 5/2002 | Sunter et al. ................ 375/376 |

OTHER PUBLICATIONS

Patent Abstract of Japan, vol. 1996, No. 11, Nov. 29, 1996 & JP 08 195674 (NEC Corp), Jul. 30, 1996.

* cited by examiner

Primary Examiner—Emmanuel Bayard
(74) Attorney, Agent, or Firm—Bachman & LaPointe, P.C.

(57) ABSTRACT

The process to measure the signal quality of a digital information transmission system using a scanning device with adjustable direct current threshold can determine a signal parameter for the signal quality (Q-factor), which can determine the bit-rate from an unknown input signal and with its help a clock signal can be generated to scan the input signal with the scanning device. The device includes a detection device as well as a clock generator, which is connected to the detection device and receives a pre-adjustment signal, and which synchronizes with the input signal over a phase locked loop with the scanning device through phase comparison. Process and device allow the monitoring of systems in a shortest time and facilitate statements concerning the bit-rate of the respective line section as well as concerning the size of the Q-factor and all relating variables.

3 Claims, 2 Drawing Sheets

PROCESS AND DEVICE TO MEASURE THE SIGNAL QUALITY OF A DIGITAL INFORMATION TRANSMISSION SYSTEM

BACKGROUND OF THE INVENTION

1. Field of the Invention

The present invention concerns a process and a device to measure the signal quality of a digital information transmission system using a scanning device with adjustable direct current threshold to determine a signal parameter for the signal quality (Q-factor).

2. Description of the Related Art

To estimate the bit-error rate (BER) of a digital information transmission system the so-called Q-factor measuring method is applied, which further produces evidence concerning the signal-to-noise ratio (S/N) of a signal, the so-called eye pattern and the system reserve. Detailed clarifications about the measurement of the Q-factor can be found in a publication by the Hewlett-Packard company, 'Measurement in High-Speed Optically Amplified Networks' as part of the seminar papers of the '1996 Lightwave Transmission Seminar', which took place in May 1996 in Boeblingen at the Hewlett-Packard company and for example in the pamphlet of the ITU (International Telecommunication Union), Study-Period 1997 to 2000, COM 15-31-E, November 1997, Question 16/15, Study Group 15— Contribution 31.

Up until now a bit-error rate of $BER<=10^{-9}$ was considered to be sufficient for electrical digital information transmission systems. However, for optical digital information transmission systems a bit-error rate $BER$ of $<=10^{-12}$ is considered necessary. To carry out a measurement also for optical digital transmission systems using the methods usually applied when measuring an electrical digital information transmission system, the measuring time is too long.

In view of the fact that in future there will be so-called transparent optical networks whose data signals are not known and therefore the network operators will have to guarantee the quality of the system, there is a need for a process and a device to determine the transmission quality. Up until now known instruments to determine the transmission quality of digital information transmission systems require a known bit-pattern or additionally a second device to generate a clock signal. While the previously mentioned device is also designed with a purely numeric output of the bit-error rate the second device performs an oscillographic evaluation of an also unknown bit-pattern.

Generally circuits are known, which synchronize with an unknown input signal. An example for this is U.S. Pat. No. 5,757,857, which shows a circuit where the frequency difference between input signal and clock signal is synchronized with the data signal.

SUMMARY OF THE INVENTION

The present invention is based on the objective of suggesting a possibility to determine and report the quality of a digital information transmission system in case of unknown signals within a few seconds.

This task will be achieved according to the invention through a process as well as through a device as described hereinbelow. Further advantageous designs are also described hereinbelow.

According to the process the bit-error rate from an unknown input signal is determined and with its help a clock signal is generated with which the input signal is scanned using the scanning device. The unknown input signal is an electrical input signal, that is generated either out of an electrical digital information transmission system or through conversion of an optical digital information transmission system. From this electrical input signal the frequency of the bits per time is determined and the clock time signal is generated. The scanning device by which the input signal is scanned is based on the method of determining the bit-error rate (BER) by means of two deciders in terms of the sensing threshold as discussed initially.

According to a preferred realization of the process the clock generator is synchronized with the data frequency by means of a frequency sensitive synchronization circuit. This can for example be achieved by means of a search oscillator or by determining the bit-rate by the number per time of the positive or negative edges of the input signal. The latter is based on the notion that the edges of a quarter of all connected bit-blocks are positive in relation to the clock rate (refer to FREQUENZ 1970/8, page 230–234—in particular table 1—, 'Eigenschaften und Anwendung von binaeren Quasi-Zufallsfolgen' by Lutz Schweizer). Based on this realization the bit-rate can be inferred from the frequency of positive or negative edges multiplied by 4 and a corresponding clock signal can be generated.

For the scanning of the input signal with the scanning device a scanning oscillator is pre-adjusted to achieve exact synchronization following a further advantageous characteristic of the process by way of the bit-rate, which corresponds to the clock signal and then the scanning oscillator is synchronized through phase comparison to the input signal. This assists the fine adjustment, whereby it is adjusted in such a way that the center of the image i.e. the center of the digital impulses can be scanned.

With the device designed according to the invention an edge counter determines the bit-rate of the unknown input signal. A clock generator is linked to the edge counter, which receives a pre-adjustment signal from it, and which synchronizes through a phase locked loop with the scanning device by phase comparison to the input signal.

A device as well as a process designed according to the invention allows therefore the monitoring of electrical and optical digital information transmission systems while the bit-rate is unknown. Thereby, the bit-rate is reported numerically. In addition, a statement about the size of the Q-factor and all variables derived from it is possible. For this reason a measuring method was suggested (Q-factor) to measure the bit-error rate alternatively to shorten the measuring time considerably. Hereby, the known input signal is scanned simultaneously with two scanners, the first (reference scanner) scanning at optimum sensing threshold and regaining the clock time from the input signal, and the second (reading scanner) scanning with variable sensing threshold. The difference between both scanning outputs (=bit-errors) is detected with an EXOR depending on the sensing threshold of the reading scanner. This principle does not require the knowledge of the signal and can be used at the active information transmission system.

The process as well as the device is based on the fact that, as is especially common with optical transmission systems, a so-called NRZ-signal is being used as a transmission signal, where the signal level 'HIGH' corresponds to a digital '1' and the signal level 'LOW' corresponds to a digital '0'.

BRIEF DESCRIPTION OF THE DRAWINGS

With reference to the figures the invention is described in more detail in the following with an example of realization. The drawings show.

DETAILED DESCRIPTION OF PREFERRED EMBODIMENT(S)

Figure 1:
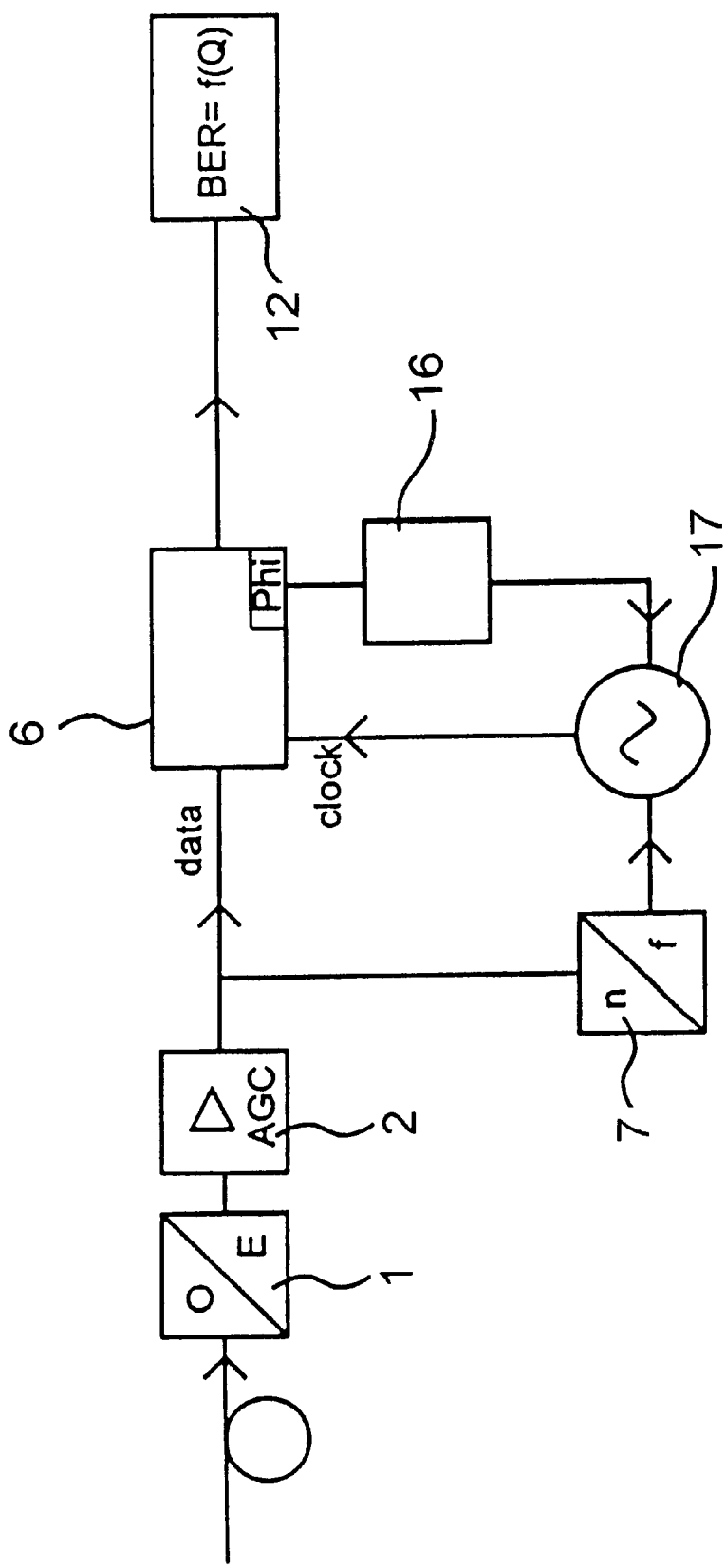
FIG. 1 A general block circuit diagram of a measuring device.

FIG. 1 shows schematically how the signal quality of an optical information transmission system is determined. The optical signal is supplied through an optical converter 1 and an amplifier 2 to a known scanning device 6 as well as to an edge counter 7. A search oscillator can be used instead of the edge counter 7, which supplies information concerning the difference between data and clock signal. The edge counter 7 (or the search oscillator) determines the bit-rate and delivers a pre-adjustment signal to a voltage-controlled oscillator 17, which delivers a clock signal. Then the bit-rate is synchronized with the input signal via a phase locked loop (PLL)16 and a phase comparison with the input signal at the scanning device 6. The scanning device 6 delivers via device 12 the bit-error rate (BER) as a function of Q.

Figure 2:
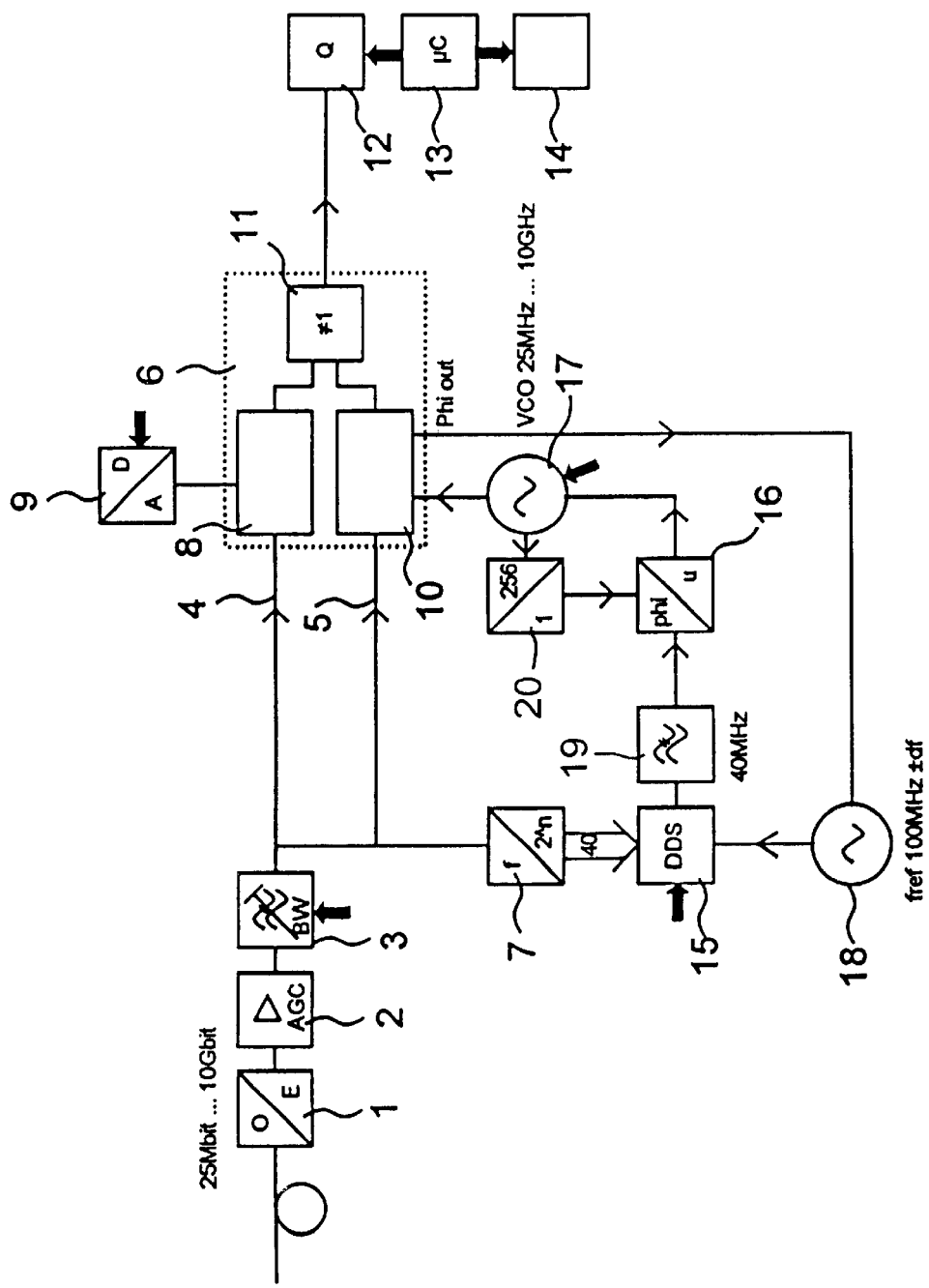
FIG. 2 a detailed block circuit diagram of a measuring device according to FIG. 1.

In FIG. 2 the schematic illustration of FIG. 1 is illustrated in more detail.

In the example of realization an unknown optical input signal with for example 25 Mbit to 10 Gbit is assumed, that is being converted over an appropriate optical converter 1 to an electrical signal. This device becomes obsolete when determining the Q-factor of an electrical signal. Following on the electrical signal is conducted by a familiar method over an amplifier 2 and a low pass filter 3 and then supplied to both channels 4,5 of a scanning device 6 as well as an edge counter 7. The measuring channel 4 of the scanning device 6 leads to a measuring decider 8, which is connected to an analogue/digital-converter 9, over which the decider threshold can be shifted. The reference channel 5 leads to a reference decider 10 and both outputs of the deciders are conducted over an EXOR-link to a bit-error rate counter 12. By means of a microprocessor 13 the Q-factor is determined by a known method from the measured bit-errors and displayed in a display device 14.

To synchronize the reference decider 10 in the scanning device 6 the bit-rate determined in the edge counter 7 is directed to a digital synthesizer 15 and the reference decider 10 is synchronized with the input signal by means of a phase locked loop (PLL)16 over a voltage-controlled oscillator (VCO) 17 as well as a reference oscillator 18. The voltage-controlled oscillator 17 operates in a frequency band of 25 MHz to 10 GHz and the reference voltage oscillator in a frequency band of 100 MHZ. The synthesizer 15 can also replace the function of the edge counter 7 by using it as a search oscillator. For this the tuning of the synthesizer 15 is modified over a broad frequency band and the information concerning the difference frequency of the data signal and the clock signal are evaluated and used for pre-adjustment of the oscillator 17.

The voltage-controlled oscillator 17 adjusts automatically to the bit-rate of the measured signal. To do that the positive or negative edges of the input signal are measured in the edge counter 7 within a certain gate time. With virtually accidental NRZ (Non Return to Zero) signals a quarter of all edges is either positive or negative, i.e. the bit-rate can be directly determined by the edge count. The microprocessor 13 sets the direct digital synthesizer (DDS) 15 in such a way that the output frequency of the clock generator 17 approximately corresponds to the bit-rate. The phase locked loop 16 changes, while combining with the phase measuring output of the EXOR-link 11, the output frequency of the direct digital synthesiser 15 after the closing of the circuit in such a way that the bit-rate corresponds to the scanning frequency. The two deciders 8,10 in the scanning device 6 are used to measure at the active transmission systems. The measuring decider 8 is shifted in its decider threshold by means of an analogue/digital-converter 9. The output of both deciders 8,10 is conducted to the EXOR-link and measured in the following bit-error rate counter 12.

What is claimed is:

1. Method for determining the signal quality of a running optical digital information transmission system, comprising the following steps:

determining the bit-rate of an unknown input signal to be examined;

regulating a clock recovery means on the determined bit-rate;

adjusting a desired phase position within one bit by comparing a phase with the input signal;

counting at least one bit-error by comparing an output signal of two signal scanning devices, wherein a first one of said scanning devices is operated with a predetermined reference scanning threshold and wherein a second one of said scanning devices is operated with a variable scanning threshold;

calculating a plurality of signal quality parameters comprising a Q-factor and a bit-error rate; and issuing the bit-rate, the Q-factor and the bit-error rate.

2. Method according to claim 1, wherein the determination of the bit-rate is performed by detecting at least one edge of the unknown input signal in consideration of the signal type.

3. A device to measure the signal quality of a digital information transmission system with a scanning device with adjustable direct current threshold, comprising a detection device which determines a bit-rate from an unknown input signal, a clock recovery means for the determined bit-rate, means for adjusting a desired phase position within one bit by comparing a phase with the input signal, means for counting at least one bit-error by comparing an output signal of two signal scanning devices, wherein a first one of said scanning devices is operated with a pre-determined reference scanning threshold and wherein a second one of said scanning devices is operated with a variable scanning threshold.

* * * * *